United States Patent
Peters et al.

(10) Patent No.: US 6,341,138 B1
(45) Date of Patent: Jan. 22, 2002

(54) CONSTANT TEMPERATURE PERFORMANCE LASER

(75) Inventors: Frank Peters, Lompoc; Michael H. MacDougal, Goleta, both of CA (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 09/334,590

(22) Filed: Jun. 16, 1999

(51) Int. Cl.$^7$ ................................................ H01S 3/08
(52) U.S. Cl. ................................................ 372/96
(58) Field of Search .......................................... 372/96

(56) References Cited

U.S. PATENT DOCUMENTS

| | | | |
|---|---|---|---|
| 5,056,098 A | 10/1991 | Anthony et al. | 372/45 |
| 5,266,794 A | 11/1993 | Olbright et al. | 250/214 LS |
| 5,274,655 A | 12/1993 | Shieh et al. | 372/45 |
| 5,343,487 A | 8/1994 | Scott et al. | 372/45 |
| 5,500,540 A | 3/1996 | Jewell et al. | 257/82 |
| 5,513,203 A | 4/1996 | Damen | 372/96 |
| 5,521,736 A | 5/1996 | Swirhun et al. | 359/158 |
| 5,568,499 A | 10/1996 | Lear | 372/45 |
| 5,625,480 A | 4/1997 | Swirhun et al. | 359/158 |
| 5,668,826 A | 9/1997 | Bezinge et al. | 372/32 |
| 5,712,865 A | 1/1998 | Chow et al. | 372/96 |
| 5,784,396 A | 7/1998 | Guerin | 372/29 |
| 5,930,276 A | 7/1999 | Dou et al. | 372/34 |
| 6,169,756 B1 * | 1/2001 | Chirovsky et al. | 372/46 |

FOREIGN PATENT DOCUMENTS

EP    0 860917    8/1998

OTHER PUBLICATIONS

Morgan RA et al., "Hybrid Dielectric/Algaas Mirror Spatially Filtered Vertical Cavity Top–Surface Emitting Laser" Applied Physics Letters, American Institute of Physics 1995; 66(10):1157–1159.

Larson MC et al. "Room Temperature Continuous–Wave Photopumped Operation of 1.22 MUM Gainnas/GAAS Single/Quantum Well Vertical–Cavity Surface–Emitting Laser" Electronics Letters 1997; 33(11):959–960.

McMahon CH et al. "Detuning of the Gain and Reflectivity Spectra and its Effect On the Output Characteristics of Vertical Cavity Surface Emitting Lasers" Applied Physics Letters 1995; 66(17):2171–2173.

Oh T–H et al. "Cavity–Induced Antiguiding in a Selectively Oxidized Vertical–Cavity Surface–Emitting Laser" IEEE Photonics Technology Letters 1998; 10(1):12–14.

Nakwaski et al., Thermal Analysis of GaAs–AlGaAs Etched–Well Surface–Emitting Double–Heterostructure Lasers with Dielectric Mirrors, Jun. 1993, IEEE Journal of Quantum Electronics, vol. 29 No. 6, p. 1981–1995.*

Qian et al., Low–Threshold Proton–Implanted 1,3–um Vertical–Cavity Top–Surface–Emitting Lasers with Dielectric and Wafer–Bonded GaAs–AlAs Bragg Mirrors, Jul. 1997, IEEE Photonics Technology Letters, vol. 9, No. 7, p. 866–868.*

* cited by examiner

Primary Examiner—James W. Davie
Assistant Examiner—Jeffrey Zahn
(74) Attorney, Agent, or Firm—Vic Genco; Eric Sheets

(57) ABSTRACT

Diode lasers are fabricated whose performance is essentially unchanged over designed temperature and bias ranges. The threshold current ($I_{th}$) and the external efficiency ($\eta_{ext}$) of the diode lasers are unchanged over a range of specified temperatures.

6 Claims, 2 Drawing Sheets

CONSTANT TEMPERATURE PERFORMANCE LASER

BACKGROUND OF THE INVENTION

1. Field of the Invention

The invention relates generally to a method of fabricating diode lasers whose performance is essentially unchanged over designed temperature and bias ranges, and more particularly to a diode laser of which the threshold current ($I_{th}$) and the external efficiency ($\eta_{ext}$) remain unchanged over a range of specified temperatures.

2. Description of the Related Art

Diode lasers are a mature technology and are used in many commercial applications. The cost of diode laser modules varies according to the specifications required by the application. If specifications are tight, the yield of the lasers may be low, or the laser modules may require thermal management (such as thermoelectric cooling). Both of these lead to high cost. Ideally one would like a diode laser that could be engineered so that output power is constant over temperature.

For simplicity, the laser is considered an electro-optic device where electrons are exchanged for photons (i.e., light). In an ideal laser the same amount of input current (electrons) will always produce the same amount of light (photons). For a laser used in communications this condition needs to be true for a large range of currents. More specifically, the laser needs to adhere to the linear relation: $P=\eta_{ext}(I-I_{th})$ where P is power, I is current, and the rest are constants.

SUMMARY OF THE INVENTION

The invention provides an improved vertical cavity surface emitting laser (VCSEL) that includes an output mirror stack having a semiconductor distributed Bragg reflector and a dielectric distributed Bragg reflector, where a center wavelength of the semiconductor distributed Bragg reflector is different than a center wavelength of the dielectric distributed Bragg reflector. According to an exemplary embodiment of the invention, the center wavelength of the dielectric distributed Bragg reflector is less than the center wavelength of the semiconductor distributed Bragg reflector and less than the lasing wavelength of the VCSEL. The semiconductor distributed Bragg reflector (DBR) is made up of materials with high and low index of refractions. The reflection at any optical interface is equal to the difference between the high and low indexes of refraction divided by the sum of the same indexes. Thus, the larger the difference between the high and low indexes of refraction, the greater the reflection at the interface. This quantity, the difference divided by the sum, will be referred to as the index contrast ratio. The semiconductor distributed Bragg reflector has an index contrast ratio that changes with temperature. The dielectric distributed Bragg reflector has an index contrast ratio that changes less with temperature than that of the semiconductor distributed Bragg reflector. As the temperature increases, the lasing wavelength of the VCSEL increases and shifts away from the center wavelength of the dielectric distributed Bragg reflector such that the dielectric distributed Bragg reflector becomes less reflective.

Other features and advantages of the invention will become apparent from the following detailed description, taken in conjunction with the accompanying drawing, which illustrate, by way of example, the features of the invention.

DETAILED DESCRIPTION

Figure 1:
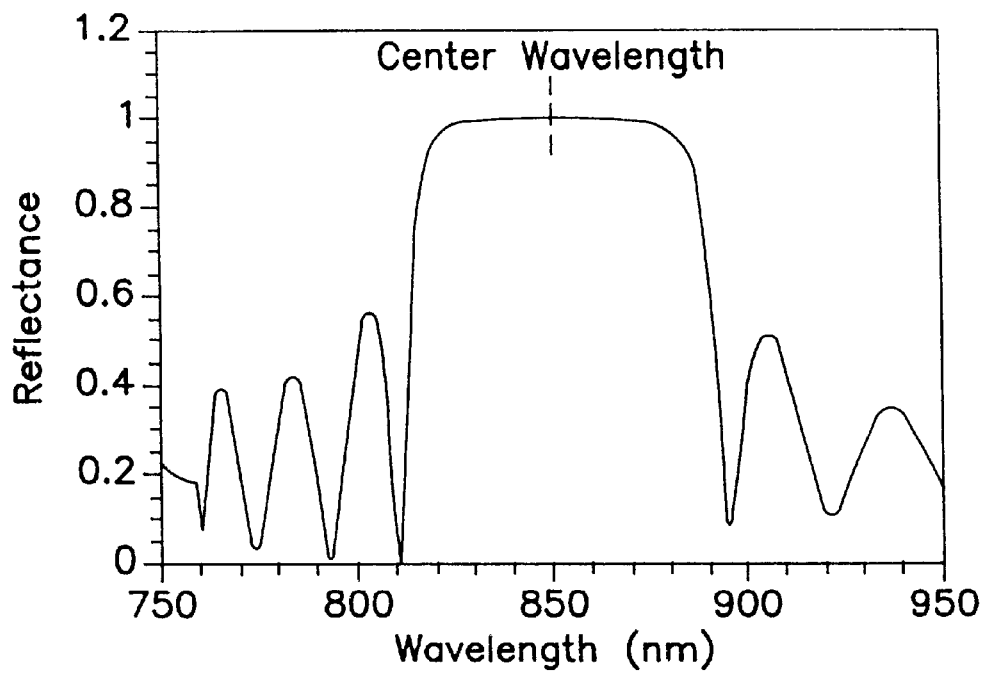
FIG. 1 illustrates the reflectance of a semiconductor distributed Bragg reflector (DBR) as a function of wavelength.

To design a temperature insensitive diode laser with a temperature insensitive external efficiency, the diode laser must have a temperature insensitive threshold current. In other words, it is desirable that the constants $\eta_{ext}$ and $I_{th}$ do not change with temperature. The constant $\eta_{ext}$ is the external efficiency (which is sometimes referred to as the differential quantum efficiency) of the laser and is typically given in units of (A/W). $I_{th}$ is referred to as the threshold current (which is the amount of current required to bring the laser into a lasing condition) and is typically given in units of A or mA. That the constants $\eta_{ext}$ and $I_{th}$ remain unchanged over temperature means that the values of the constants only undergo minute changes or changes too small to adversely affect a communications link in which the diode laser is deployed.

The threshold current ($I_{th}$) is dependent on a number of factors such as the gain medium in the diode laser, the amount of internal losses (such as free carrier loss) and the amount of feedback provided by the mirrors. Over temperature, the internal losses may change, the amount of feedback may change and the amount of gain provided by the gain medium will change. Therefore, to force this parameter into a constant regime over temperature is not trivial.

In a typical edge-emitting diode laser, numerous longitudinal modes are present, and as a result, the dominant longitudinal mode is the one whose wavelength corresponds to the position of peak gain from the gain medium. As the diode laser operates over temperature with a fixed current, the peak amount of gain decreases, and the threshold current of the diode laser increases. This is considered an inherent property of an edge-emitting laser. Thus, temperature control is often utilized to ensure constant threshold current.

In other types of semiconductor diode lasers, numerous longitudinal modes are not supported. These types include vertical cavity surface emitting lasers (VCSELs) and distributed feedback lasers (DFBs).

A vertical cavity surface emitting laser (VCSEL) is a semiconductor diode laser including a semiconductor layer of optically active material, such as gallium arsenide or indium gallium arsenide, sandwiched between mirror stacks formed of highly-reflective layers of metallic material, dielectric material or epitaxially-grown semiconductor material. Lasers require optical confinement in an optical cavity and carrier confinement to efficiently convert pumping electrons into stimulated photons through population inversion. The standing wave of reflected electromagnetic energy in the optical cavity has a characteristic cross-section giving rise to an electromagnetic mode. A desirable electromagnetic mode is the single fundamental mode, for example, the $HE_{11}$ mode of a cylindrical waveguide.

VCSELs and DFBs are designed such that there is only one dominant longitudinal mode. As a result the wavelength of the lasing mode may not correspond to the position of the peak gain. The semiconductor gain spectra shifts toward longer wavelength with increasing temperature. Also, the index of refraction of semiconductors increases with increasing temperature, and the physical lattice constant increases with increasing temperature. Both of these last two parameters cause an increase in the optical path length of the material (defined as the index of refraction times the physical length). An increase in the optical path length results in a wavelength shift toward longer wavelength in the lasing mode of both VCSELs and DFBs. For VCSELs, the gain peak has been measured to shift faster with temperature (~3 Å/°C.) than the lasing mode (~0.5–1 Å/°C.). Thus, at a unique temperature the peak of the gain is aligned with the lasing mode. At this temperature the threshold current will be at a minimum and will increase as the temperature is changed in either direction. If the temperature of minimum threshold current is in the middle of the desired temperature range, the laser will have optimum temperature performance (in terms of threshold current) for this type of structure.

This design has fundamental limitations. Over very small temperature ranges the threshold current may be nearly constant. For larger temperature ranges, such as those required for commercial communication products the threshold current changes are noticeable. The principles of the invention can be used to design lasers that give much more constant performance over temperature.

The gain medium itself can be engineered to its inherent temperature sensitivity. For example, if one looks at a VCSEL designed with different gain offsets (that is, where the gain and lasing modes are aligned at different temperatures), the minimum threshold current can be engineered over a wide range of temperatures. If one uses different types of gain offsets (typically produced by quantum wells with different composition and/or thickness), the gain profile can be designed to have multiple peaks or purely a broad peak. This technique can be used to ensure that as the temperature changes the threshold current remains nearly constant since the amount of gain that is aligned with the lasing mode also remains constant. Thus, choosing the correct combination of gain elements can compensate for gain variability over temperature for fixed longitudinal wavelength types of lasers (e.g., VCSELs and DFBs).

The external efficiency ($\eta_{ext}$) of a device depends on the amount of light transmitted from the laser cavity (T) and the amount of light lost inside the laser cavity (L), such that $\eta_{ext}=T/(T+L)$. Temperature change has four significant effects on the device. First, as already noted, the index of refraction changes with temperature. For a semiconductor device, this fact means that the reflectance of the mirrors changes. The reflectance difference changes the amount of transmitted light which in turn changes the external efficiency. Second, the amount of loss in a laser increases with increasing temperature. This loss results in a decrease in the external efficiency. Third, for lasers such as VCSELs whose mirrors are made up of more than one optical interface, the index contrast ratio of the mirrors will change with temperature, thus changing the external efficiency. In a VCSEL, the index contrast ratio of semiconductor DBRs increases with temperature, such that the VCSEL DBRs become more reflective, and the external efficiency is reduced.

The final effect is based on different material systems. In conventional VCSELs, the DBRs and the gain (i.e., active) region are both composed of the same type of material (i.e., semiconductors). Therefore, as the index contrast ratio changes with temperature, so does the lasing wavelength of the VCSEL. The center wavelength of the DBR (as illustrated in FIG. 1) also shifts with the device temperature such that the lasing mode retains the same alignment with the DBRs. Thus, only the index contrast ratio shift is important.

Figure 2:
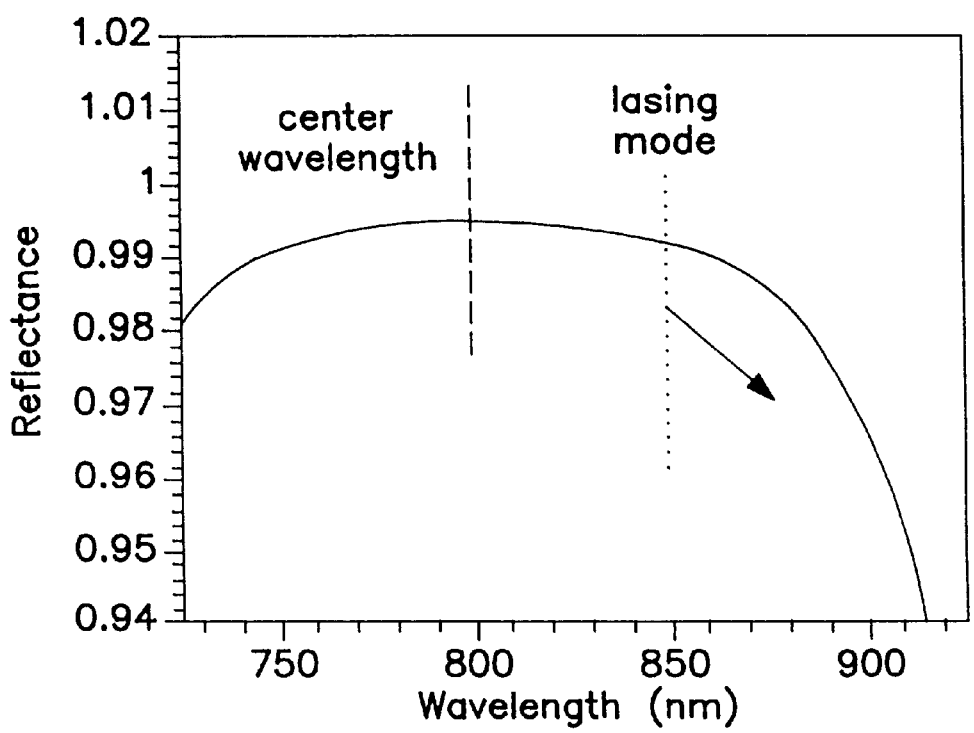
FIG. 2 illustrates the reflectance of a dielectric DBR as a function of wavelength.

Alternatively, VCSELs have been made with DBRs made up of different material systems which are commonly referred to as dielectric mirrors. The semiconductor materials typically used to make VCSELs, such as AlGaAs are dielectric materials. Other optically transparent dielectric materials can also be used to form the distributed Bragg reflectors used in VCSELs. Many of these dielectric materials have indexes of refraction that change much less than the semiconductor dielectrics when the temperature changes. In this text, dielectric will be used to describe dielectric materials whose index of refraction changes much less with temperature than the semiconductor materials. Examples of these dielectric materials are $TiO_2$, $SiO_2$, ZnO, etc. Using those materials, the center wavelength of the DBRs no longer shifts with temperature at the same rate as the lasing mode. This characteristic creates a new ability to tailor the performance of the device according to the principles of the invention. If a material system is chosen where the index contrast ratio shifts at a slower rate with temperature than the host semiconductor of the device, one can alter the temperature performance based on how the lasing mode is aligned with the DBR as taught herein. In FIG. 2, it is shown that if the operating wavelength (the lasing mode) increases, then the reflectance of the dielectric DBR decreases. If the DBR is centered at a shorter wavelength than the lasing mode, as the temperature is increased, the lasing mode shifts away from the center wavelength of the DBR. As a consequence, the reflectivity of the DBR decreases, forcing the external efficiency to increase as the temperature rises, as illustrated in FIG. 2. By aligning the lasing mode on the other side of the center wavelength of the DBR, an increase in temperature will result in an increase in reflectivity, causing a decrease in the external efficiency according to the principles of the invention.

The definition of the external efficiency is complicated by the effect of threshold current changes. For a device with constant threshold current, the external efficiency is the same whether measured CW (continuous wave) or pulsed. If the threshold current is not constant, the CW and pulsed threshold currents are not identical. This effect can be seen clearly in edge-emitting lasers. Typically the threshold currents increase with increasing temperature. At a certain temperature, a nearly exponential increase of threshold current occurs. Near this regime, a CW measurement of the external efficiency will be quite different from a pulsed measurement. At much cooler temperatures the external efficiency will appear to be nearly constant regardless of the measurement technique. Communication applications utilize a 50% modulation of the current. Therefore, the working definition of external efficiency assumes that it is measured at 50% duty cycle.

It has already been stated that a standard edge-emitting laser cannot be made with a constant threshold current over temperature, whereas a diode laser with a controlled longitudinal mode (such as a VCSEL or DFB) can be so designed. For a standard VCSEL, the change in the DBR index contrast ratio forces the external efficiency to change, even if the threshold current is constant. It is possible to design a VCSEL in such a way to achieve an external efficiency that is constant over temperature.

In the following description, the VCSEL has already been engineered to have a constant threshold current over temperature, but the technique can still be used, however, if the threshold current is not constant.

If a VCSEL has a flat threshold current, the external efficiency is purely related to changes in internal losses, such as transmission and absorption loss. It has been mentioned that both of these parameters change with temperature. These effects can be compensated such that the external efficiency is held constant.

Figure 3:
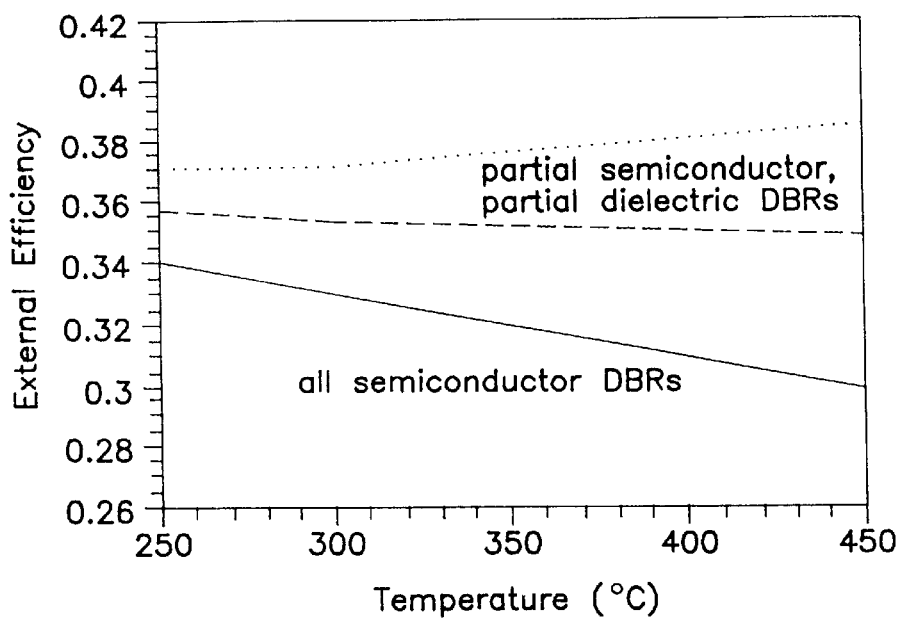
FIG. 3 illustrates the estimated change in external efficiency as a function of temperature for conventional vertical cavity surface emitting lasers (VCSELs) and VCSELs designed in accordance with the principles of the invention.

A DBR made up of different materials can be used to counteract the effect of a semiconductor DBR. If at least a partial semiconductor DBR is desired, its effects on external efficiency can be countered by using a partial DBR of another material system. Starting with a VCSEL whose first semiconductor DBR has an index contrast ratio that increases with temperature and whose internal losses may increase with temperature such that the external efficiency decreases with temperature, compensation is required. One can then choose a DBR made up of a material system (such as a dielectric mirror) whose index changes less with temperature than the semiconductor, and align this second DBR such that its center wavelength is at a shorter wavelength than the VCSELs lasing wavelength. As the temperature increases, the lasing mode shifts toward longer wavelength, away from the center wavelength of the second DBR. This results in the second DBR becoming less reflective with temperature, as illustrated in FIG. 2. By choosing the appropriate thickness of the initial semiconductor DBR and the second DBR, a device whose external efficiency no longer changes with temperature is achieved according to the principles of the invention, as illustrated in FIG. 3. FIG. 3 includes curves for a conventional all-semiconductor VCSEL and VCSELs designed in accordance with the principles of the invention.

Figure 4:
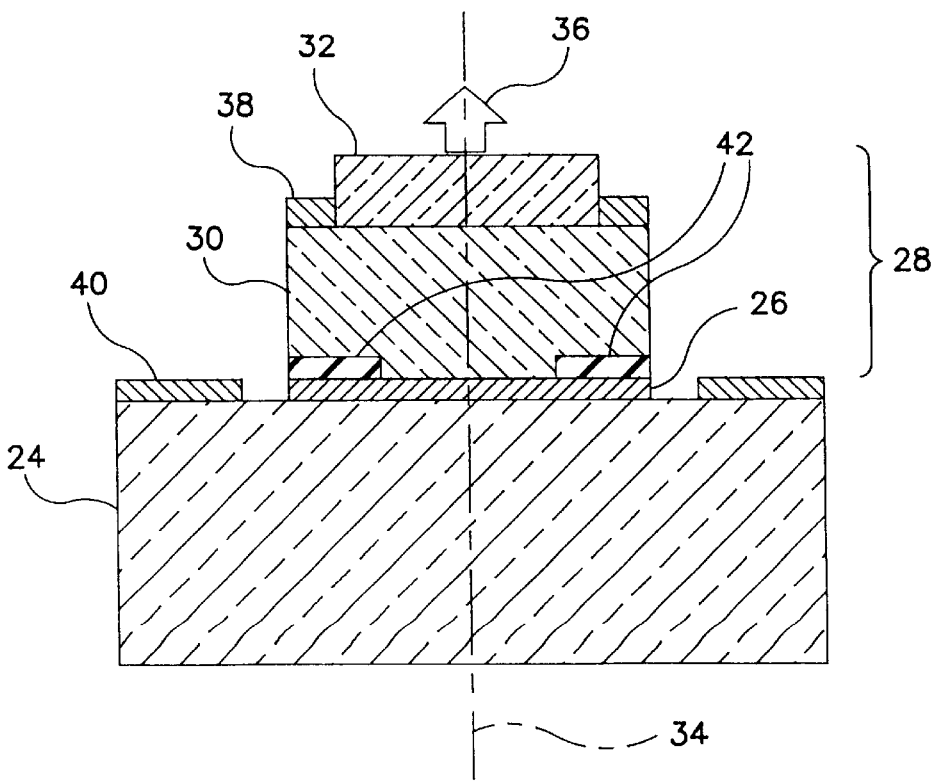
FIG. 4 illustrates a VCSEL designed in accordance with the principles of the invention.

An exemplary embodiment of the invention is depicted in FIG. 4. With reference to FIG. 4, a VCSEL includes a bottom mirror stack 24. The bottom mirror stack 24 is organized as a system of alternating layers of high-refractive index and low-refractive index semiconductor materials forming a semiconductor distributed Bragg reflector (DBR). An active region 26 including an active material for photon generation is disposed above the bottom mirror stack 24. An output mirror stack 28 is disposed above the active region 26. The output mirror stack 28 includes a first top mirror 30 and a second top mirror 32. The first top mirror 30 is a system of alternating high-refractive index and low-refractive index semiconductor materials forming a semiconductor distributed Bragg reflector (DBR). The second top mirror 32 is a system of alternating high-refractive index and low-refractive index dielectric materials forming a DBR. The first top mirror 30 is disposed above the active region 26. The second top mirror 32 is disposed above the first top mirror 30. The bottom mirror stack 24, the active region 26 and the output mirror stack 28 (which includes the first top mirror 30 and the second top mirror 32) are located on the same side of a substrate (not shown).

The output mirror stack 28 is organized as two systems of alternating layers of high and low-refractive index materials (a first system of semiconductor materials and a second system of dielectric materials) forming a multiple distributed Bragg reflector (DBR) system. The bottom mirror stack 24, the active region 26, and the output mirror stack 28 form an optical resonating cavity having a central vertical axis 34.

The first top mirror DBR 30 in the output mirror stack 28 is a semiconductor mirror that has an index contrast ratio that changes with temperature. The second top mirror DBR 32 in the output mirror stack is a dielectric mirror selected to have an index contrast ratio that changes less with temperature than the semiconductor mirror. The second top mirror DBR 32 is aligned such that its center wavelength is at a shorter wavelength than the VCSEL's lasing wavelength.

As the temperature increases, the lasing mode shifts toward a longer wavelength, away from the center wavelength of the second top mirror DBR 32. As a result, the second top mirror DBR 32 becomes less reflective with temperature. By choosing the appropriate thickness of the first top mirror (semiconductor DBR) 30 and the second top mirror (dielectric DBR) 32, one can achieve a laser whose external efficiency no longer changes with temperature, in accordance with the principles of the invention.

For light emission in the wavelength range of about 600 to 1000 nanometers, the low-refractive index layers of the first top mirror DBR 30 are preferably aluminum arsenide, AlAs, or aluminum gallium arsenide, AlGaAs; and the high-refractive index layers of the first top mirror DBR 30 are preferably gallium arsenide, GaAs, or AlGaAs having a lower aluminum content than the high-refractive index layers. Other compound semiconductor compositions may be used for other wavelength ranges.

For light emission in the wavelength range of about 600 to 1000 nanometers, the high and low-refractive index layers of the second top mirror DBR 32 are selected from dielectric materials, such as $TiO_2$, $SiO_2$, and ZnO, such that the center wavelength of the second top mirror 32 DBR does not shift with temperature at the same rate as the lasing mode.

The reflectivities of the mirror stacks in a VCSEL are defined by adjusting the number of periods (i.e., pairs of alternating layers of high-refractive index and low-refractive index materials) in each mirror stack. A VCSEL can be either top-emitting or bottom-emitting depending on the reflectivity of the mirror stacks therein.

In the top-emitting VCSEL illustrated in FIG. 4, the bottom mirror stack preferably has a reflectivity of greater than 99% and the output mirror stack preferably has a reflectivity of about 95–99%. The reflectivity of the output mirror stack is reduced to provide light emission from the VCSEL in the vertical direction as shown by arrow 36.

Referring to FIG. 4, a metallized top contact 38 is applied to the first top mirror 30 so that the VCSEL can be electrically pumped. The top contact 38 has an annular shape circumscribing the second top mirror 32 and is centered about the central vertical axis 34. A metallized bottom contact 40 is applied to the bottom mirror stack 24, so that current flows through the output mirror stack 28, the active region 26, and the bottom mirror stack 24. The bottom contact 40 has an annular shape circumscribing the active region 26, and is centered about the central vertical axis 34. An annular current confinement region 42 of high electrical resistivity is located between the active region 26 and the first top mirror 30, centered about the central vertical axis 34. The high-resistivity current confinement region 42 channels injected current into a central portion of the active region 26 for more efficient light generation therein.

The wavelength of the laser light produced by the VCSEL is determined by the active material used in the active region of the VCSEL. A given active material has a characteristic wavelength or wavelengths at which it will lase based on the atomic structure of the material.

While several particular forms of the invention have been illustrated and described, it will also be apparent that various modifications can be made without departing from the spirit and scope of the invention.

What is claimed is:

1. An improved vertical cavity surface emitting laser (VCSEL) wherein the improvement comprises:
    an output mirror stack having a semiconductor distributed Bragg reflector and a dielectric distributed Bragg reflector;
    wherein the semiconductor distributed Bragg reflector has an index contrast ratio that changes with temperature;
    wherein the dielectric distributed Bragg reflector has an index contrast ratio that changes less with temperature than that of the semiconductor distributed Bragg reflector;
    wherein the distributed Bragg reflector and the dielectric distributed Bragg reflector are made from different material;
    wherein a center wavelength of the semiconductor distributed Bragg reflector is different than a center wavelength of the dielectric distributed Bragg reflector;
    wherein the VCSEL has a lasing wavelength; and
    the center wavelength of the dielectric distributed Bragg reflector is at a shorter wavelength than the lasing wavelength.

2. The article of claim 1, wherein:
    the center wavelength of the dielectric distributed Bragg reflector is less than the center wavelength of the semiconductor distributed Bragg reflector.

3. The article of claim 2, wherein:
    as the temperature increases, the lasing wavelength increases and shifts away from the center wavelength of the dielectric distributed Bragg reflector.

4. The article of claim 3, wherein:
    the dielectric distributed Bragg reflector becomes less reflective with temperature.

5. A vertical cavity surface emitting laser (VCSEL), comprising:
    a bottom mirror stack
    an output mirror stack;
    an active region interposed between the output mirror stack and the bottom mirror stack;
    wherein the output mirror stack comprises a first top mirror and a second top mirror;
    wherein said first top mirror includes alternating layers of high-reflective index material and low-reflective index material and forms a distributed Bragg reflector with an index contrast ratio that changes with temperature;
    wherein said second top mirror includes alternating layers of high-reflective index material and low-reflective index material and forms a distributed Bragg reflector with an index contrast ratio that changes less with temperature than that of the first top mirror;
    wherein the first top mirror and the second top mirror are made from different materials; and
    wherein the first top mirror and the second top mirror are designed with their maximum reflectance at different wavelengths.

6. The VCSEL of claim 5, wherein:
    the output mirror stack is organized as two systems of alternating layers of high and low-refractive index materials; and
    the two systems include a first system of semiconductor materials and a second system of dielectric materials.

* * * * *